United States Patent
Choi et al.

(10) Patent No.: US 7,560,976 B2
(45) Date of Patent: Jul. 14, 2009

(54) METHOD OF OPERATING A SEMICONDUCTOR DEVICE AND THE SEMICONDUCTOR DEVICE

(75) Inventors: Seouk-Kyu Choi, Hwasung-si (KR); Nam-Jong Kim, Yongin-Si (KR); Il-Man Bae, Suwon-si (KR); Jong-Hyun Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 40 days.

(21) Appl. No.: 11/711,615

(22) Filed: Feb. 28, 2007

(65) Prior Publication Data

US 2007/0153614 A1 Jul. 5, 2007

Related U.S. Application Data

(62) Division of application No. 11/005,023, filed on Dec. 7, 2004, now Pat. No. 7,203,097.

(30) Foreign Application Priority Data

Jul. 27, 2004 (KR) .............. 2004-58589
Sep. 2, 2004 (KR) .............. 2004-69786

(51) Int. Cl.
  *H03K 3/01* (2006.01)

(52) U.S. Cl. .................................. 327/534; 327/544
(58) Field of Classification Search ................ 327/534, 327/544
  See application file for complete search history.

(56) References Cited

U.S. PATENT DOCUMENTS

| | | | |
|---|---|---|---|
| 5,446,700 A | 8/1995 | Iwase | |
| 5,880,604 A * | 3/1999 | Kawahara et al. | 326/83 |
| 6,097,067 A * | 8/2000 | Ouchi et al. | 257/369 |
| 6,100,563 A | 8/2000 | Arimoto | |
| 6,232,793 B1 | 5/2001 | Arimoto et al. | |
| 6,327,211 B1 | 12/2001 | Kai et al. | |
| 6,635,934 B2 * | 10/2003 | Hidaka | 257/369 |
| 7,326,972 B2 * | 2/2008 | Ghoneima et al. | 257/208 |

* cited by examiner

*Primary Examiner*—Quan Tra
(74) *Attorney, Agent, or Firm*—Harness, Dickey & Pierce, P.L.C.

(57) ABSTRACT

In one example embodiment, a speed circuit path includes inverter chains that are controllable to operate in a slower, low sub-threshold leakage current mode or a faster, higher sub-threshold leakage current mode depending on an operating mode of the semiconductor device. A non-speed circuit path includes inverter chains that operate to reduce sub-threshold leakage current regardless of an operating mode of the semiconductor device.

24 Claims, 9 Drawing Sheets

US 7,560,976 B2

METHOD OF OPERATING A SEMICONDUCTOR DEVICE AND THE SEMICONDUCTOR DEVICE

DOMESTIC PRIORITY INFORMATION

This is a divisional application of application Ser. No. 11/005,023 filed Dec. 7, 2004, now U.S. Pat. No. 7,203,097 the entire contents of which are hereby incorporated by reference.

FOREIGN PRIORITY INFORMATION

This application claims the benefit of priority under 35 U.S.C. 119 on Korean Patent Application No. 2004-58589, filed Jul. 27, 2004, and Korean Patent Application No. 2004-69786, filed Sep. 2, 2004, the disclosures of which are hereby incorporated herein by reference in their entirety.

BACKGROUND OF INVENTION

Typical of integrated semiconductor devices such as DRAMs, SRAMs, etc. is the desire to increase integration while decreasing the power supply voltage. To accomplish this, the threshold voltage (e.g., the gate-to-source voltage) to turn on the large number of MOS transistors included in such integrated circuit devices has been decreased. However, a reduction of the threshold voltage of the MOS transistors corresponding to the power supply voltage may increase the sub-threshold leakage current of the MOS transistors. The sub-threshold leakage current may be thought as the current leaking through the MOS transistor when the MOS transistor is meant to be in an off state.

This leakage current problem is particularly noticeable with respect to the CMOS inverter chains included in the integrated semiconductor devices. Many of the circuit elements in an integrated semiconductor device include one or more CMOS inverter chains. To combat this sub-threshold leakage current, the integrated circuit device may be operated in a standby mode or active mode. In the active mode, the circuit elements operate at their normal high speed. In the standby mode, each circuit element operates in a way to reduce leakage current, but also at a reduced operating speed. For example, one or more transistors in the CMOS inverter chains of each circuit element may have their bulk biases changed in the standby mode to reduce the sub-threshold leakage current.

SUMMARY OF THE INVENTION

The present invention provides an integrated semiconductor device and method of operation that combat sub-threshold leakage current in a more intelligent manner. Recognizing that some circuit paths of one or more circuit elements in an integrated semiconductor device determine the operating speed of the device during a given operation, these circuits are selectively controlled to reduce the sub-threshold leakage current depending on the operating mode. Furthermore, those circuits that do not determine the operating speed of the device during a given operation are operated to reduce the sub-threshold leakage current regardless of the operating mode.

For example, in a semiconductor memory device, the inventors have recognized that during a row active operation, the circuit path for generating a word line enable signal for addressing a row of memory cells in a memory array determines the operating speed of this operation, while in comparison, the circuit path for generating a sensing enable signal to sense the data output from the memory array does not. Accordingly, the circuit path for generating the word line enable signal includes, for example, inverter chains that selectively reduce the sub-threshold leakage current depending on the operating mode. And, the circuit path for generating the sensing enable signal includes, for example, inverter chains that reduce the sub-threshold leakage current regardless of the operating mode.

The present invention further provides an inverter chain that is selectively controllable to reduce the sub-threshold leak current depending on the operating mode. In one embodiment, the inverter chain includes a plurality of inverters connected in series where each succeeding inverter has a different set of fixed bulk biases applied thereto than a set of fixed bulk biases applied to a preceding inverter regardless of an operating mode of the inverter chain.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EXEMPLARY EMBODIMENTS

An inverter chain according to embodiments of the present invention will be described followed by descriptions of integrated semiconductor devices, which may incorporate the inverter chain.

Inverter Chain

Figure 1:
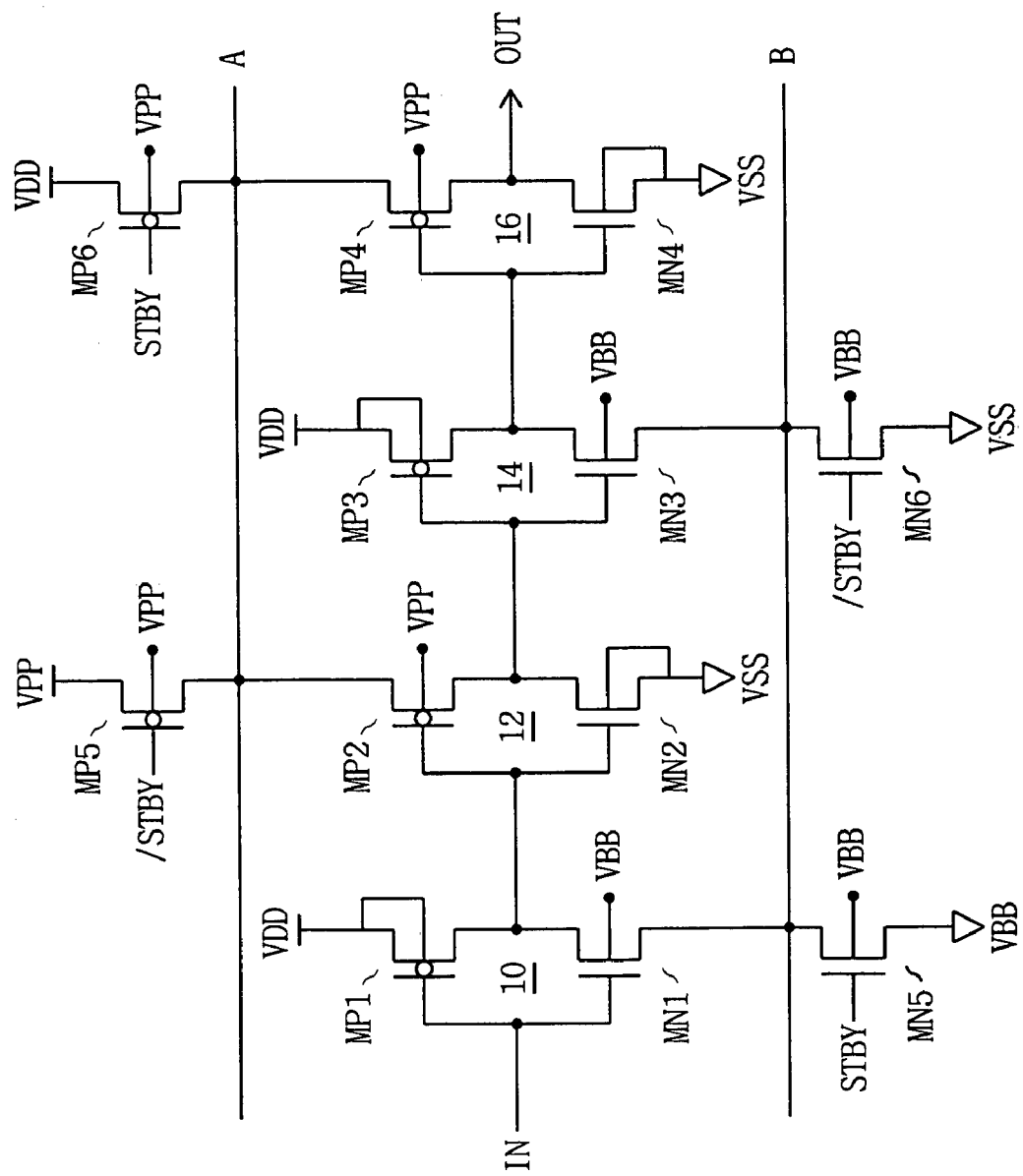
FIG. 1 illustrates a CMOS inverter chain that may selectively reduce sub-threshold leakage current according to an embodiment of the present invention.

FIG. 1 illustrates a CMOS inverter chain according to an embodiment of the present invention. As shown, first-fourth CMOS inverters 10, 12, 14 and 16 are connected in series with the first inverter 10 receiving an input IN and the fourth inverter 16 producing the output OUT. Each of the first-fourth inverters 10, 12, 14 and 16 includes a PMOS transistor connected in series with an NMOS transistor.

Specifically, the first inverter 10 includes a first PMOS transistor MP1 connected in series with a first NMOS transistor MN1 between a first high potential or voltage VDD (e.g., 3 volts) and a low potential or voltage line B. As will be described in detail below, the low potential line B may carry a first low potential VSS (e.g., ground) or a second low potential VBB; where the second low potential VBB is less than the first low potential VSS. The source and bulk of the first PMOS transistor MP1 are connected to the first high potential VDD, while the gate receives the input IN and the drain is connected to the drain of the first NMOS transistor MN1. The common connection between the drains of the first NMOS and PMOS transistors MN1 and MP1 serves as the output of the first inverter 10. The gate of the first NMOS transistor MN1 also receives the input IN. Accordingly, the gates of the first NMOS and PMOS transistors MN1 and MP1 serve as the input of the first inverter 10. The source of the first NMOS transistor MN1 is connected to the low potential line B and the bulk is biased at the second low potential VBB.

The second inverter 14 includes a second PMOS transistor MP2 connected in series with a second NMOS transistor MN2 between a high potential or voltage line A and the first low potential VSS. As will be described in detail below, the high potential line A may carry the first high potential VDD or a second high potential VPP; where the second high potential VPP is greater than the first high potential VPP. The source and bulk of the second NMOS transistor MN2 are connected to the first low potential VSS, while the gate receives the output from the first inverter 10 and the drain is connected to the drain of the second PMOS transistor MP2. The common connection between the drains of the second NMOS and PMOS transistors MN2 and MP2 serves as the output of the second inverter 12. The gate of the second PMOS transistor MP2 also receives the output of the first inverter 10. Accordingly, the gates of the second NMOS and PMOS transistors MN2 and MP2 serve as the input of the second inverter 12. The source of the second PMOS transistor MP2 is connected to the high potential line A and the bulk is biased at the second high potential VPP.

The third inverter 14 includes a third PMOS transistor MP3 connected in series with a third NMOS transistor MN3 between the first high potential VDD and the low potential line B. The source and bulk of the third PMOS transistor MP3 are connected to the first high potential VDD, while the gate receives the output from the second inverter 12 and the drain is connected to the drain of the third NMOS transistor MN3. The common connection between the drains of the third NMOS and PMOS transistors MN3 and MP3 serves as the output of the third inverter 14. The gate of the third NMOS MN3 transistor also receives the output of the second inverter 14. Accordingly, the gates of the third NMOS and PMOS transistors MN3 and MP3 serve as the input of the third inverter 14. The source of the third NMOS transistor MN3 is connected to the low potential line B and the bulk is biased at the second low potential VBB. As will be appreciated, the third inverter 14 has the same structure and is connected between the first high potential VDD and the low potential line B in the same fashion as the first inverter 10. Furthermore, the third inverter 14 has the same fixed bulk biases applied thereto as the first inverter 10.

The fourth inverter 16 includes a fourth PMOS transistor MP4 connected in series with a fourth NMOS transistor MN4 between the high potential line A and the first low potential VSS. The source and bulk of the fourth NMOS transistor MN4 are connected to the first low potential VSS, while the gate receives the output from the third inverter 14 and the drain is connected to the drain of the fourth PMOS transistor MP4. The common connection between the drains of the fourth NMOS and PMOS transistors MN4 and MP4 serves as the output of the fourth inverter 16. The gate of the fourth PMOS transistor MP4 also receives the output of the third inverter 14. Accordingly, the gates of the fourth NMOS and PMOS transistors MN4 and MP4 serve as the input of the fourth inverter 16. The source of the fourth PMOS transistor MP4 is connected to the high potential line A and the bulk is biased at the second high potential VPP. As will be appreciated, the fourth inverter 16 has the same structure and is connected between the first low potential VSS and the high potential line A in the same fashion as the second inverter 12. Furthermore, the fourth inverter 16 has the same fixed bulk biases applied thereto as the second inverter 12. It will further be appreciated that while the inverter chain has been shown as comprised of four inverters, the present invention is not limited to this number of inverters. Instead, the inverter chain may be increased or decreased by following the inverter pattern described and illustrated with respect to FIG. 1, where each succeeding inverter has a different set of bulk biases applied thereto than a set of bulk biases applied to a preceding inverter.

FIG. 1 further illustrates that a fifth PMOS transistor MP5 is connected between the second high potential VPP and the high potential line A. The fifth PMOS transistor MP5 has its bulk biased at the second high potential VPP, and the gate of the fifth PMOS transistor MP5 receives the inverse of a standby signal. Accordingly, based on the standby signal, the fifth PMOS transistor selectively applies the second high potential VPP to the high potential line A. Somewhat similarly, a sixth PMOS transistor MP6 is connected between the first high potential VDD and the high potential line A. The sixth PMOS transistor MP6 has its bulk biased at the first high potential VDD, and the gate of the sixth PMOS transistor MP6 receives the standby signal. Accordingly, based on the standby signal, the sixth PMOS transistor selectively applies the first high potential VDD to the high potential line A.

A fifth NMOS transistor MN5 and sixth NMOS transistor MN6 are also connected to the low potential line B. The fifth NMOS transistor MN5 is connected between the second low potential VBB and the low potential line B. The fifth NMOS transistor MN5 has its bulk biased at the second low potential VBB, and the gate of the fifth NMOS transistor MN5 receives the standby signal. Accordingly, based on the standby signal, the fifth NMOS transistor MN5 selectively applies the second low potential VBB to the low potential line B. The sixth NMOS transistor MN6 is connected between the first low potential VSS and the low potential line B. The sixth NMOS transistor MN6 has its bulk biased at the first low potential VSS, and the gate of the sixth NMOS transistor MN6 receives the inverse of the standby signal. Accordingly, based on the standby signal, the sixth NMOS transistor MN6 selectively applies the first low potential VSS to the low potential line B.

Next, the operation of the inverter chain illustrated in FIG. 1 will be described. The inverter chain may be operated in an active mode or a standby mode in accordance with the operation of the integrated semiconductor device incorporating the inverter chain. The standby mode of operation will be described first. In the standby mode, the input IN is a logic high voltage such as the first high potential VDD and the standby signal is a logic high voltage such as the first high potential VDD. The high potential of the standby signal results in the fifth PMOS and NMOS transistors MP5 and MN5 turning on. Accordingly, the high potential line A carries the second high potential VPP and the low potential line B carries the second low potential VBB.

With the input IN being the first high potential VDD, the first PMOS transistor MP1 is turned off and the first NMOS transistor is turned on. Accordingly, the output of the first inverter 10, and therefore, the input of the second inverter 12 is pulled down to the voltage carried on the low potential line B—the second low potential VBB. Because the second low potential VBB is applied to the gate of the second NMOS transistor MN2, the second NMOS transistor is turned off. Furthermore, because the second low potential VBB at the gate of the second NMOS transistor MN2 is less than the first low potential VSS at the source of the second NMOS transistor MN2, the second NMOS MN2 is further driven into the off state than if the source and gate voltage were equal. As a result, the sub-threshold leakage current at the second NMOS transistor MN2 is reduced.

The second low potential VBB at the gate of the second PMOS transistor MP2 turns on the second PMOS transistor MP2 such that the second inverter 12 outputs the second high potential voltage VPP from the high potential line A. Accordingly, the gates of the third PMOS and NMOS transistors MP3 and MN3 receive the second high potential voltage VPP. This turns off the third PMOS transistor MP3 and turns on the third NMOS transistor MN3. Because the second high potential VPP at the gate of the third PMOS transistor MP3 is greater than the first high potential VDD at the source of the third PMOS transistor MP3, the third PMOS MP3 is further driven into the off state than if the source and gate voltage were equal. As a result, the sub-threshold leakage current at the second NMOS transistor MN2 is reduced. With the third NMOS transistor MN3 on, the output of the third inverter 14, and therefore, the input of the fourth inverter 16 is pulled down to the second low potential VBB.

The fourth inverter 16 then operates in the same manner as the second inverter 12 such that the second high potential VPP is output and leakage current through the fourth NMOS transistor MN4 is reduced.

The active mode of operation will now be described. In the active mode, the input IN is a logic low voltage such as the first low potential VSS and the standby signal is a logic low voltage such as the first low potential VSS. The low potential of the standby signal results in the sixth PMOS and NMOS transistors MP6 and MN6 turning on. Accordingly, the high potential line A carries the first high potential VDD and the low potential line B carries the first low potential VSS.

With the input IN being the first low potential VSS, the first PMOS transistor MP1 is turned on and the first NMOS transistor is turned off. Accordingly, the output of the first inverter 10, and therefore, the input of the second inverter 12 is the voltage carried on the high potential line A—the first high potential VDD. Because the high potential VDD is applied to the gate of the second PMOS transistor MP2, the second PMOS transistor MP2 is turned off. Furthermore, because the first high potential VDD at the gate of the second PMOS transistor MP2 is the same as the first high potential VDD at the source of the second PMOS transistor MP2, the second PMOS MP2 is susceptible to greater sub-threshold leakage than if the gate voltage was the second high voltage VPP. However, the second PMOS transistor MP2 may switch states more quickly than if the second PMOS transistor MP2 received the second high potential VPP at its gate. Also, because the bulk bias of the second high potential VPP for the second PMOS transistor MP2 is greater than the first high potential VDD at the source of the second PMOS transistor MP2, the turn on threshold for the second PMOS transistor MP2 is greater than if the bulk bias and source voltage were equal. Consequently, this reduces the sub-threshold leakage current.

The first high potential VDD at the gate of the second NMOS transistor MN2 turns on the second NMOS transistor MN2 such that the second inverter 12 outputs the first low potential voltage VSS on the low potential line B. Accordingly, the gates of the third PMOS and NMOS transistors MP3 and MN3 receive the first low potential voltage VSS. This turns off the third NMOS transistor MN3 and turns on the third PMOS transistor MP3. Because the first low potential VSS at the gate of the third NMOS transistor MN3 is the same as the first low potential VSS at the source of the third NMOS transistor MN3, the third NMOS MN3 is susceptible to greater sub-threshold leakage than if the gate voltage was the second low voltage VBB. However, the third NMOS transistor MN3 may switch states more quickly than if the third NMOS transistor MN3 received the second low potential VBB at its gate. Also, because the bulk bias of the second low potential VBB for the third NMOS transistor MN3 is less than the first low potential VSS at the source of the third NMOS transistor MN3, the turn on threshold for the third NMOS transistor MN3 is greater than if the bulk bias and source voltage were equal. Consequently, this reduces the sub-threshold leakage current.

The fourth inverter 16 then operates in the same manner as the second inverter 12 such that the first low potential VSS is output.

Integrated Semiconductor Device

Row Activate Operation

Figure 2:
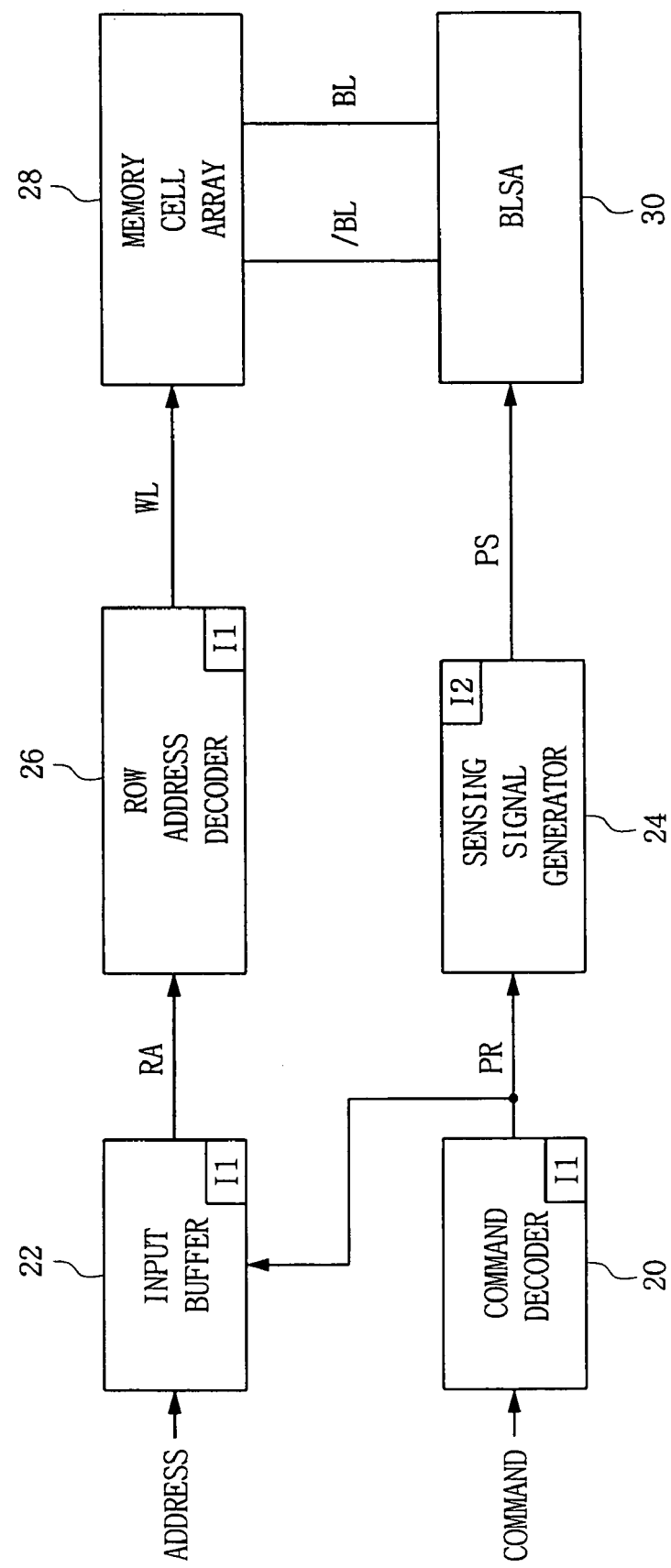
FIG. 2 illustrates a well-known portion of a semiconductor memory device involved in a row activation operation of the memory device that has been modified according to an embodiment of the present invention.

Next, portions of an integrated semiconductor device according to an embodiment of the present invention will be described. FIG. 2 illustrates a well-known portion of a semiconductor memory device responsible for a row activation operation that has been modified according to an embodiment of the present invention. As shown, a command decoder 20 receives and decodes a command, and outputs a decoded command signal to an input buffer 22 and a sensing signal generator 24. The command may be a row active command, which instructs that a word line or lines of a memory array 28 be activated or enabled in accordance with a received address. The input buffer 22 buffers a received address, which indicates the word line or word lines to activate, based on the decoded command signal. A row address decoder 26 receives the address output from the buffer 22. The row address decoder 26 decodes the address to generate a word line enable signal WL for enabling a word line in the memory cell array 28. A bit line sense amplifier (BLSA) 30 senses the data addressed from the memory cell array 28. The BLSA 30 operates in response to an bit line sense enable signal PS generated by the sensing signal generator 24 in response to the decoded command signal PR.

Figure 3:
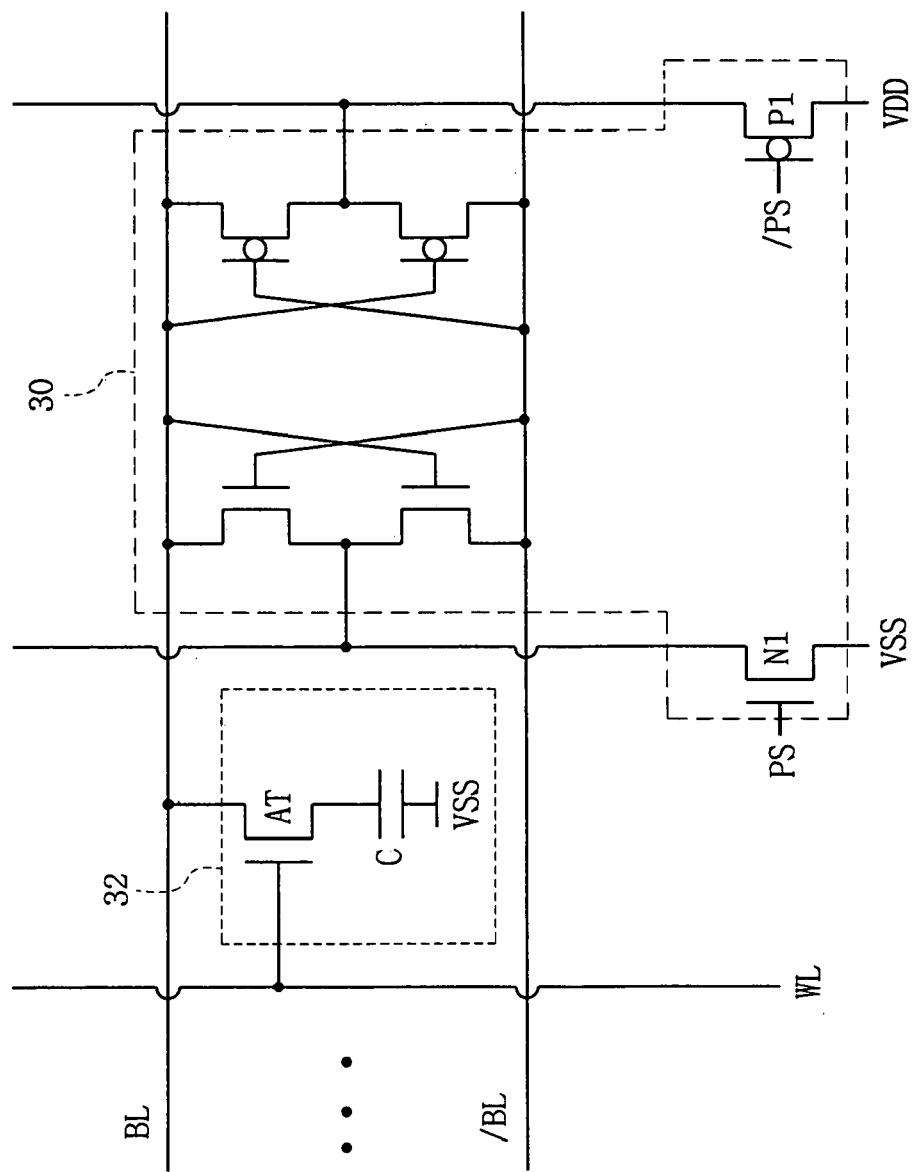
FIG. 3 illustrates a portion of the memory cell array and a bit line sense amplifier.

FIG. 3 illustrates a portion of the memory cell array 28 and the BLSA 30. Specifically, FIG. 3 illustrates one memory cell 32 of the memory cell array 28 connected to a corresponding portion of the BLSA 30. The structure and operation of the memory cell 32 and the corresponding BLSA 30 are extremely well-known, and readily apparent from the circuit diagram in FIG. 3; accordingly, for the sake of brevity the only those operations pertinent to the present invention will be described. As is known, the memory cell 32 outputs the data stored in capacitor C when the word line enable signal enables the word line WL of the access transistor AT to turn on the access transistor AT during a read operation. The stored charge is then read onto the bit line BL and, through charge sharing, the bit bar line /BL. The charge difference between the bit line BL and bit bar line /BL is amplified by the BLSA 30 to sense the data; for example, being read from the memory cell 32. However, whether the BLSA 30 operates to sense the data depends on the sensing enable signal PS output by the sensing signal generator 24.

As shown, an enabling NMOS transistor N1 is connected between an internal node of the BLSA 30 and the first high potential VDD, and receives the sensing enable signal PS at its gate. Also, an enabling PMOS transistor P1 is connected between an internal node of the BLSA 30 and the first low potential VSS, and receives an inverse of the sensing enable signal /PS at its gate. As will be readily appreciated, when the sensing enable signal PS is a logic high value, the enabling NMOS and PMOS transistors N1 and P1 turn on such that the internal nodes of the BLSA 30 are pulled to the first high and low potentials VDD and VSS, respectively. Consequently, the BLSA 30 is enabled to perform the sensing/amplifying operation. By contrast, when the sensing enable signal PS is logic low, the enabling NMOS and PMOS transistors N1 and P1 turn off such that the BLSA 30 can not perform the sensing operation.

In the row activation process, the inventors have recognized that the circuit path for generating the word line enable signal WL determines the operating speed of the row activation process as compared to the circuit path for generating the sensing enable signal PS for enabling the BISA 30. Accordingly, the circuit elements in the word line enable signal generating path have been modified such that the inverter chain or chains therein are a first inverter chain I1. This is diagrammatically illustrated by the boxes I1 in FIG. 2. As shown, the command decoder 20, the input buffer 22 and the row address decoder 26 include one or more inverter chains I1. The first inverter chain I1 is selectively controllable to operate in a slower and low sub-threshold leakage current mode or a faster and higher sub-threshold leakage current mode. When a word line is to be enabled such as during a row activate operation, the first inverter chains I1 may be set in the faster mode, but when a word line is not being enabled, the first inverter chains I1 may be set in the slower mode. FIG. 1 is one example of an inverter chain that may be used as the first inverter chain I1. Other example inverter chains that may be used as the first inverter chain I1 will be discussed in detail below with respect to FIG. 6.

By contrast the circuit elements of the bit line sense amplifier enable signal generating path not in the word line enable signal generating path; namely, the sensing signal generator 24, have been modified such that the inverter chain or chains therein are a second inverter chain I2. This is diagrammatically illustrated by the boxes I2 in FIG. 2. The second inverter chain I2 operates in a slower, low sub-threshold leakage current mode regardless of the operating mode of the semiconductor memory device. Examples of inverter chains that may be used as the second inverter chain I2 will be discussed in detail below with respect to FIG. 5.

Figure 4:
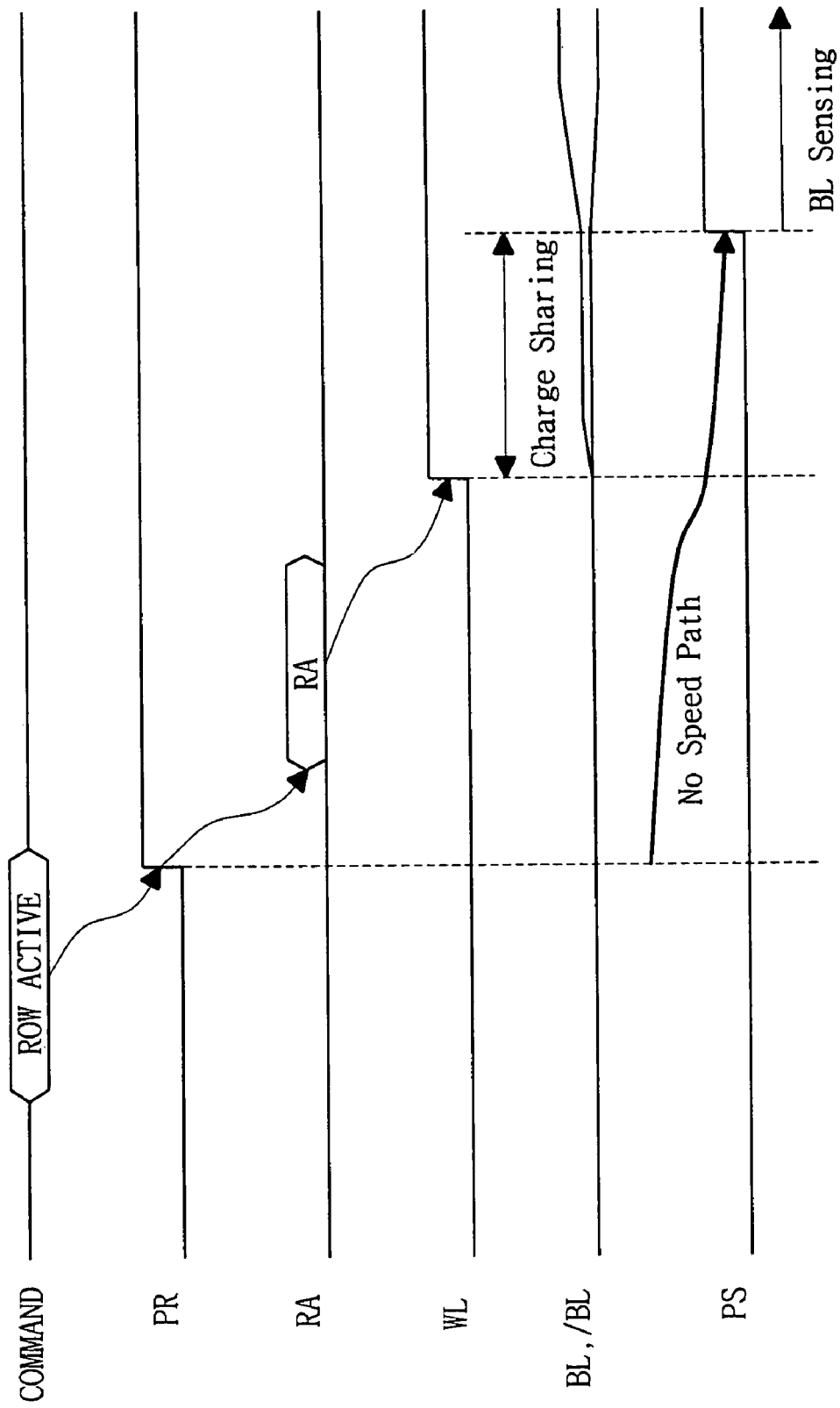
FIG. 4 illustrates a waveform timing diagram showing the timing of the signals generated during a row activate operation of the circuit portion shown in FIG. 2.

FIG. 4 is a waveform timing diagram showing the timing of the signals generated during a row activate operation of the circuit portion shown in FIG. 2, which has been modified according to an embodiment of the present invention. The operation of the circuit portion shown in FIG. 2 will now be described in greater detail with reference to FIG. 4. As shown, the command decoder 20 receives the row active command and subsequently generates the decoded row active command signal PR. The input buffer 22 receives the decoded row active command signal PR and outputs the address RA buffered therein. The row address decoder 26 decodes the address RA and outputs a word line enable signal WL on the word line or lines indicated by the address RA. This turns on the access transistors AT connected to the enabled word line, and the bit and bit bar lines BL and /BL associated with the turned on access transistors AT begin the charge sharing operation discussed above.

Meanwhile, the sensing signal generator 24, in response to the decoded row active command signal, generates a sensing enable signal PS to enable the portions of the BLSA 30 associated with the bit and bit bar lines BL and /BL undergoing the charge sharing operation.

Accordingly, for the row active operation, the integrated semiconductor device of FIG. 2 includes a word line enable signal generating path for generating the word line enable signal that includes the command decoder 20, the input buffer 22, and the row address decoder 26. The integrated semiconductor device further includes a bit line sense amplifier enable generating path (also referred to as a sensing signal generating path) that includes the command decoder 20 and the sensing signal generator 24. As shown, in FIG. 4, the BLSA 30 does not need to be enabled until a short time after the beginning of the charging operation. Accordingly, the operating speed of the integrated semiconductor device during the row active operation is governed by the operating speed of the word line enable generating path. The bit line sense amplifier enable generating path is a no speed path; namely, may have a much slower operating speed.

Having recognized this, the inventors have modified the well-known semiconductor integrated circuit of FIG. 2 to use a low power consumption (e.g., low sub-threshold leakage current) inverter chain I2 described in detail below with respect to FIG. 5, which may operate more slowly, as the inverter chain or chains in the sensing signal generator 24.

Figure 5:
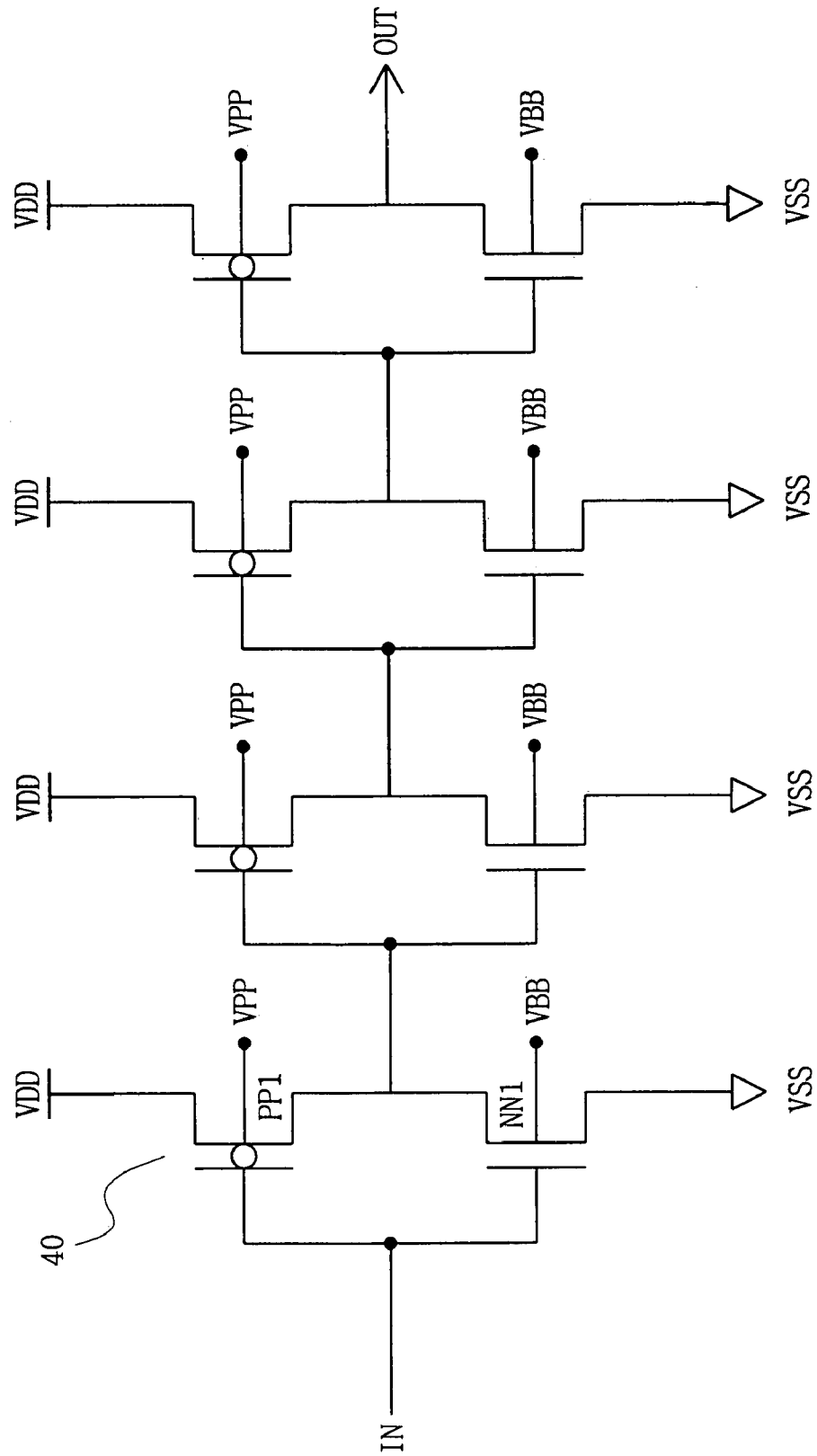
FIG. 5 illustrates an example of an inverter chain having a reduced sub-threshold leakage current.

FIG. 5 illustrates an example of an inverter chain having a reduced sub-threshold leakage current. As shown, the inverter chain includes a series of inverters 40, four in this example, having their inputs connected to the output of the previous inverter; except for the first inverter 40, which receives the input IN, and the last inverter 40, which serves as the output OUT of the inverter chain. Each inverter 40 includes a PMOS transistor PP1 connected in series with an NMOS transistor NN1 between the first high potential VDD and the first low potential VSS. The second high potential VPP is applied to the bulk of the PMOS transistors PP1, and the second low potential VBB is applied to the bulk of the NMOS transistors NN1. Because the bulk bias of the second high potential VPP for the PMOS transistors PP1 is greater than the first high potential VDD at the source of the PMOS transistors PP1, the turn on threshold for the PMOS transistors PP1 is greater than if the bulk bias and source voltage were equal. Consequently, this reduces the sub-threshold leakage current. Furthermore, because the bulk bias of the second low potential VBB for the NMOS transistors NN1 is less than the first low potential VSS at the source of the NMOS transistors NN1, the turn on threshold for the NMOS transistors is greater than if the bulk bias and source voltage were equal. Consequently, this reduces the sub-threshold leakage current.

In an alternative embodiment, the bulk bias applied to the NMOS transistors NN1 is the first low potential VSS, while the bulk bias applied to the PMOS transistors PP1 remains the second high potential VPP. In a further alternative embodiment, the bulk bias applied to the PMOS transistors PP1 is the first high potential VDD, while the bulk bias applied to the NMOS transistors remains the second low potential VBB.

Figure 6:
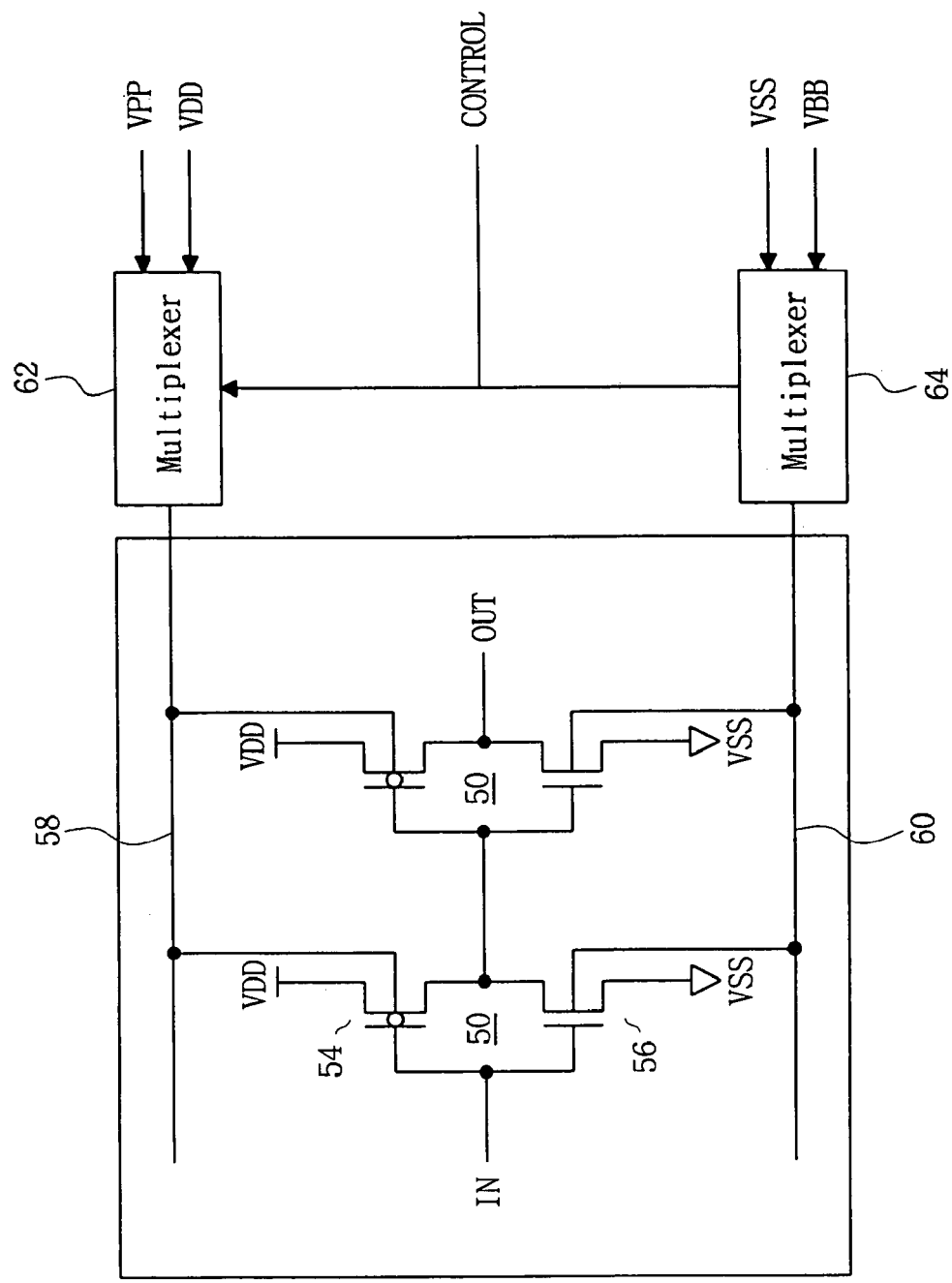
FIG. 6 illustrates another inverter chain, which may selectively reduce sub-threshold leakage current.

As yet another alternative, either of the inverter chains of FIGS. 1 and 6, fixedly set in the reduced sub-threshold leakage current mode may be used as the second inverter chain I2.

As discussed above with respect to FIG. 2, the inventors have modified the circuit of FIG. 2 to use an inverter chain I1 such as the inverter chain of FIG. 1 as the inverter chains in the word line enable signal generating path. This allows the word line enable signal generating path to operate at a faster speed in the active mode than in the standby mode. Here, the active mode is when the row active command is received, and standby mode is when no row active command is received. Thus, when no operation with respect to a row active command is required sub-threshold leakage current in the word line enable signal generating path may be reduced, and power consumption by the integrated semiconductor device is therefore reduced. However, the inverter chain or chains of the sensing signal generator 24 operate the same regardless of the operating mode of the integrated semiconductor device.

Instead of the inverter chain of FIG. 1, any inverter chain that allows for selectively reducing the sub-threshold leakage current and/or selectively increasing the speed of the inverter chain may by used as inverter chain I1. For example, FIG. 6 illustrates another inverter chain which may be operated in an active mode and a standby mode. In the active mode, such as when a row activate command is received, the sub-threshold leakage current is not reduced as compared to when the inverter chain operates in the standby mode. However, the inverter chain does operate more quickly in the active mode than the standby mode.

As shown in FIG. 6, the inverter chain, for purposes of explanation only, includes two inverters 50 with the input of the second inverter 50 connected to the output of the first inverter 50. As will be appreciated, the size of the inverter chain may be increased by adding inverters 50 to the chain. The first inverter 50 receives the input IN at its input, and the output of the second inverter 50 provides the output OUT of the inverter chain.

Each of the inverters 50 includes a PMOS transistor 54 connected in series with an NMOS transistor 56 between the first high potential VDD and the first low potential VSS. The bulk of the PMOS transistor 54 is biased by a potential on a high potential line 58 and the bulk of the NMOS transistor 55 is biased by a potential on a low potential line 60. A first multiplexer 62 selectively applies either the first or second high potential VDD or VPP to the high potential line 58 based on a control signal. A second multiplexer 64 selectively applies either the first or second low potential VSS or VBB to the low potential line 64 based on the control signal.

Next, operation of the inverter chain of FIG. 6 will be described. When applied to the present invention, the control signal may be the standby signal. Accordingly, when the standby signal indicates the standby mode, the first and second multiplexers 62 and 64 respectively may apply the second high and low potentials VPP and VBB to the high and low potential lines 58 and 60, respectively. As such, the inverter chain of FIG. 6 will operate in the same manner as the inverter chain of FIG. 5. Namely, the sub-threshold leakage current will be reduced, but the inverter chain will operate more slowly.

In the active mode, the first and second multiplexers 62 and 64 respectively apply the first high and low potentials VDD and VSS to the high and low potential lines 58 and 60, respectively. As such, the sub-threshold leakage current is not reduced as compared to the standby mode, but the inverter chain operates more quickly.

As will be appreciated, in the inverter chain of FIG. 6, the sub-threshold leakage current and speed of the inverter chain may be controlled through the selective application of the bulk biases based on the operating mode of the inverter chain, or for example, the operating mode of the integrated semiconductor device or circuit element thereof including the inverter chain. This may be contrasted with the inverter chain of FIG. 5 in which the same bulk biases are applied regardless of the operating mode.

While this embodiment has been described as setting the inverter chain I1 in the slower, reduced sub-threshold leakage current operating mode when the semiconductor device is in the standby mode, it should be appreciated that this embodiment permits selectively placing the inverter chain I1 in the slower or faster operating mode when the semiconductor device is in the standby mode.

Row Precharge Operation

Figure 7:
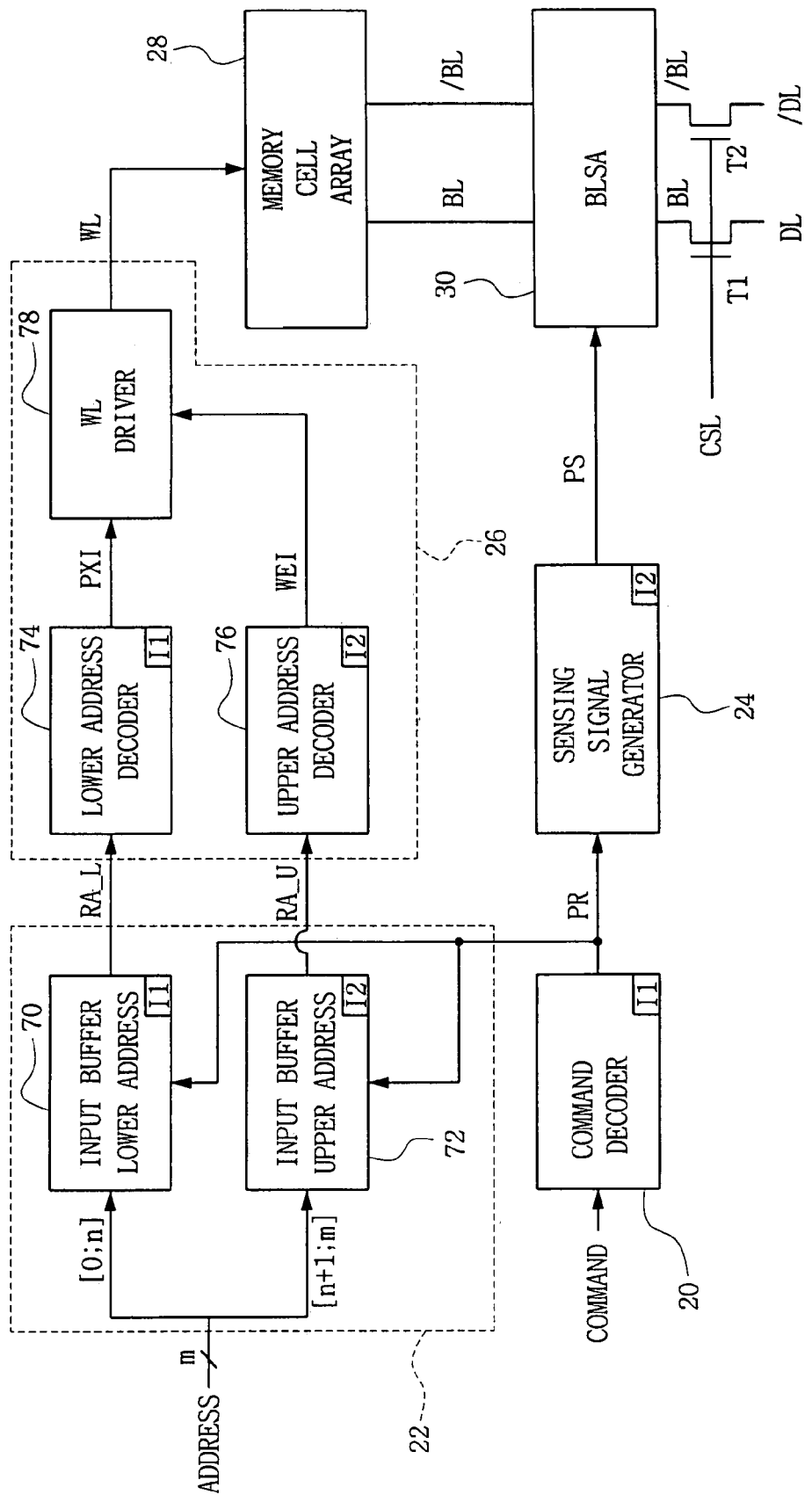
FIG. 7 illustrates a well-known portion of a semiconductor memory device involved in a row precharge operation of the memory device that has been modified according to an embodiment of the present invention.

Next, another portion of an integrated semiconductor device according to an embodiment of the present invention will be described. FIG. 7 illustrates a well-known portion of a semiconductor memory device responsible for a row precharge operation that has been modified according to an embodiment of the present invention. A row precharge operation is an operation for deactivating or disabling an enabled word line or lines when a row precharge command is applied to the memory device. As shown, a command decoder 20 receives and decodes a command (e.g., a row precharge command), and outputs a decoded command signal to an input buffer 22 and a sensing signal generator 24. The input buffer 22 includes a lower address input buffer 70 and an upper address input buffer 72 that buffer a lower portion (e.g., least significant bits) and an upper portion (e.g., most significant bits) of a received address. A row address decoder 26 includes a lower address decoder 74 and an upper address decoder 76 that respectively receive the lower and upper address portions output from the lower and upper address input buffers 70 and 72, respectively. The lower address decoder 74 decodes the lower address portion into a first word line drive signal PXI, and the upper address decoder 76 decodes the upper address portion into a second word line drive signal WEI. A word line driver 78 in the address decoder 26 then, during a row precharge operation, deactivates one or more word lines WL based on the first and second word line drive signals PXI and WEI.

FIG. 7 further shows a memory cell array 28, bit line sense amplifier 30 and sensing signal generator 24 as in FIG. 2. Furthermore, FIG. 7 shows that the data on each pair of bit and bit bar lines BL and /BL are selectively transferred to a respective pair of data lines DL and /DL by first and second transfer transistors T1 and T2, respectively, based on a column select signal CSL in the well known manner. As one skilled in the art will appreciate, only one pair of bit and bit bar lines and one pair of data lines has been shown for ease of illustration and description. However, numerous such pairs exist in a memory device.

In the row precharge operation, the inventors have recognized that the circuit path for enabling the word line; and therefore, disabling the word line determines the operating speed of the row precharge operation. Specifically, the inventors have recognized that the precharge operation depends largely on the first word line drive signal PXI. Recognizing this, the inventors consider the circuit path for generating the first word line signal PXI a speed path, while the circuit path for generating the second word line drive signal WEI is considered a non-speed path. Therefore, in the embodiment of FIG. 7, the command decoder 20, the lower address input buffer 70, and the lower address decoder 74 forming the first word line drive signal path, which is part of the word line signal enable path, have been modified such that the inverter chains are inverter chains I1 that allow selectively reducing the sub-threshold leakage current such as in FIG. 1 or FIG. 6.

By contrast, the circuit elements of the non-speed paths such as the upper address input buffer 72, the upper address decoder 76 and the sensing signal generator have been modified to include inverter chains I2 that reduce sub-threshold leakage current regardless of the operating mode of the memory device. For example, these circuit elements includes the inverter chain of FIG. 5.

Figure 8:
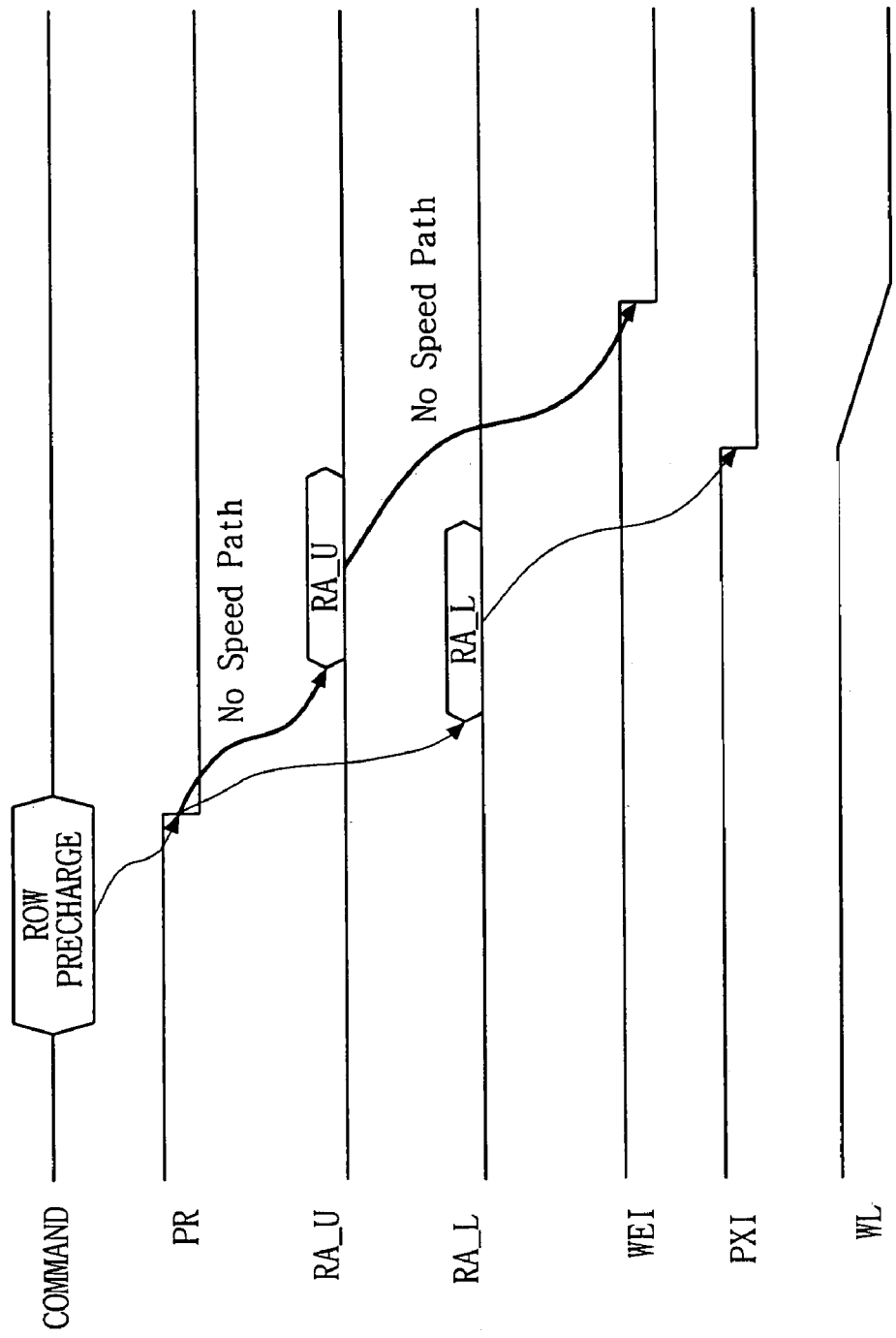
FIG. 8 illustrates a waveform timing diagram showing the timing of the signals generated during a row precharge operation of the circuit portion shown in FIG. 7.

FIG. 8 illustrates a waveform timing diagram showing the timing of the signals generated during a row precharge operation of the circuit portion shown in FIG. 7. As shown, the command decoder 20 receives the row precharge command and subsequently generates the decoded row precharge command signal PR. Because the lower address input buffer 70 operates more quickly than the upper address input buffer 72, the lower address input buffer 70 outputs the lower address portion RA_L before the upper address input buffer 72 outputs the upper address portion RA_U. Similarly, the lower address decoder 74 decodes lower address portion RA_L and generates the first word line drive signal PXI before the upper address decoder 76 decodes the upper address portion RA_U and generates the second word line drive signal WEI. In response to the first word line drive signal PXI and subsequently received second word line drive signal WEI, the word line driver 78 deactivates one or more word lines as shown in FIG. 8.

While this embodiment has been described as setting the inverter chain I1 in the slower, reduced sub-threshold leakage current operating mode when the semiconductor device is in the standby mode, it should be appreciated that this embodiment permits selectively placing the inverter chain I1 in the slower or faster operating mode when the semiconductor device is in the standby mode.

Read/Write Operation

Figure 9:
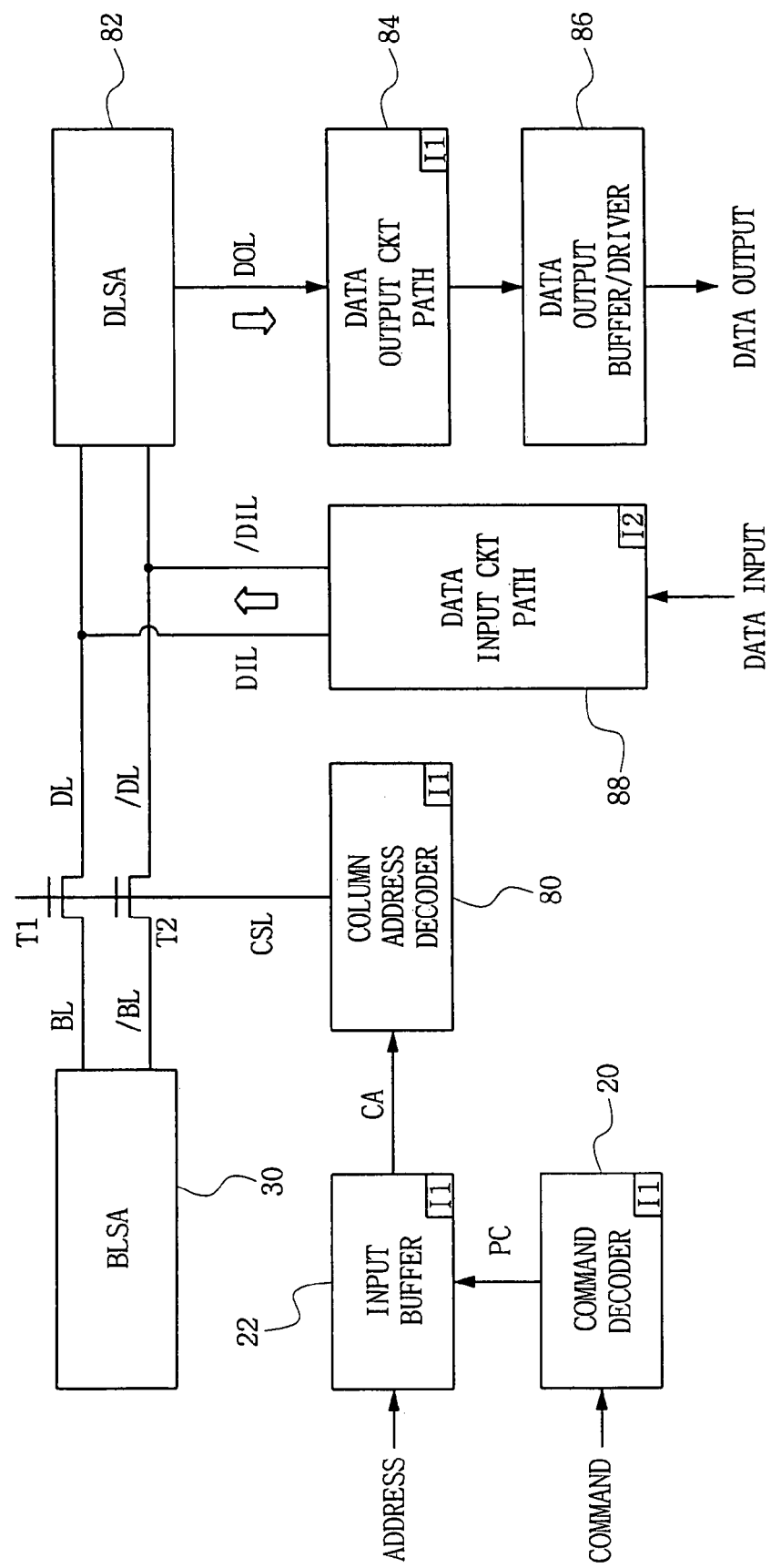
FIG. 9 illustrates a well-known portion of a semiconductor memory device involved in a read and write operation of the memory device that has been modified according to an embodiment of the present invention.

Next, another portion of an integrated semiconductor device according to an embodiment of the present invention will be described. FIG. 9 illustrates a well-known portion of a semiconductor memory device responsible for a read or write (read/write) operation. As shown, a command decoder 20 receives and decodes a command (e.g., a read or write command PC), and outputs a decoded command signal to an input buffer 22. The input buffer 22 buffers a received address (e.g., a row and/or column address) for addressing a memory cell array. FIG. 9 illustrates the input buffer 22 outputting the column address CA based on the decoded read/write command PC to a column address decoder 80. The column address decoder 80 decodes the column address and based thereon enables a column select signal CSL on one or more column select lines. Namely, the column address decoder 80 generates a column select signal CSL on the column select line indicated by the decoded column address.

As discussed above with respect to FIG. 7, the data on each pair of bit and bit bar lines BL and /BL from the BLSA 30 are selectively transferred to a respective pair of data lines DL and /DL by first and second transfer transistors T1 and T2, respectively, based on a column select signal CSL received on the column select line. For ease of illustration and description, on one pair of bit and bit bar lines BL and /BL and one pair of data lines DL and /DL have been shown in FIG. 9, but one skilled in the art will appreciate that numerous such pairs exist in a memory device.

During a write operation, the data transferred to the data lines DL and /DL is amplified by a data line sense amplifier (DLSA) 82. The amplified data is output along a well-known data output circuit path 84 (e.g., including an output buffer, etc.) and data output driver 86. During a read operation, data is received and transferred to the data lines DL and /DL by a data input circuit path 88, which includes, for example, a data input buffer (not shown).

The inventors have recognized that the circuit elements involved in outputting data during a read operation is a speed path affecting the operation of the memory device. By contrast, the inventors have recognized that the path taken by data during a write operation is not a speed path. As such, the circuit elements affecting the speed of a read operation have been modified such that the inverter chains in these circuit elements may be a modified version I1' of the inverter chains I1 such as shown in FIG. 1 or FIG. 6. For example, with respect to the inverter chain I1 of FIG. 1, the inverter chain I1 has been modified by fixing the potential applied to the high and low potential lines A and B. The first high potential VDD may be fixedly applied to the high potential line A and the first low potential VSS may be fixedly applied to the low potential line B such that the inverter chain I1' operates in the faster operating mode. With respect to the inverter chain I1 of FIG. 6, the inverter chain I1 has been modified by fixing the bulk bias applied to the PMOS transistors 54 to VDD and by fixing the bulk bias applied to the NMOS transistors 56 to VSS such that the inverter chain I1' operates in the faster operating mode. As shown in FIG. 9, the command decoder 20, the input buffer 22, the column address decoder 80, and the data output circuit path 84 have been modified to include the modified inverter chains I1'.

Furthermore, the circuit elements of the non-speed paths such as the data input circuit path 88 have been modified to include inverter chains I2 that reduce sub-threshold leakage current. For example, these circuit elements includes the inverter chain of FIG. 5.

CONCLUSION

While the embodiments of the present invention have been described with respect to portions of a memory device as the integrated semiconductor device, it will be appreciated that the present invention is not limited in application to these portions of a memory device or to memory devices. Instead, when circuit paths affecting the operating speed of an integrated semiconductor device and circuit paths not affecting the operating speed of an integrated semiconductor device depending on the various operations of the device are identified or recognized, then the speed paths may be modified to include inverter chains that may selectively reduce sub-threshold leakage current based on the operating mode of the device and the non-speed paths may be modified to include inverter chains that reduce the sub-threshold leakage current regardless of the operating mode of the device.

The invention being thus described, it will be obvious that the same may be varied in many ways. Such variations are not to be regarded as a departure from the spirit and scope of the invention, and all such modifications as would be obvious to one skilled in the art are intended to be included within the scope of the present invention.

We claim:

1. An inverter chain, comprising:
    a plurality of inverters connected in series, each inverter in the series including a PMOS transistor and an NMOS transistor connected in series between a higher potential and a lower potential, and the plurality of inverters being greater than two, each succeeding inverter having a different set of bulk biases applied thereto than a set of bulk biases applied to a preceding inverter, the bulk biases applied to the inverters being fixed;

a first potential control circuit selectively supplying the higher potential to at least one of the inverters in the series based on an operating mode of the inverter chain; and a second potential control circuit selectively supplying the lower potential to at least a different one of the inverters in the series based on the operating mode of the inverter chain.

2. The inverter chain of claim 1, wherein even numbered inverters in the series have a same first set of bulk biases applied thereto and odd numbered inverters in the series have a same second set of bulk biases applied thereto, the first set of bulk biases differing from the second set of bulk biases.

3. The inverter chain of claim 1, wherein
the succeeding inverter has a first bulk bias applied to the PMOS transistor and a second bulk bias applied to the NMOS transistor; and
the preceding inverter has a third bulk bias applied to the PMOS transistor and a fourth bulk bias applied to the NMOS transistor, the first bulk bias being greater the third bulk bias, the third bulk bias being greater than the second bulk bias, and the second bulk bias being greater than the fourth bulk bias.

4. The inverter chain of claim 3, wherein
the first potential control circuit selectively supplies the first and third bulk bias to a source of the PMOS transistor in the succeeding inverter based on the operating mode of the inverter chain; and
the second potential control circuit selectively supplies the second and fourth bulk bias to a source of the NMOS transistor in the preceding inverter based on the operating mode of the inverter chain.

5. The inverter chain of claim 4, wherein
the first potential control circuit supplies the first bulk bias in a standby mode and the third bulk bias in an active mode; and
the second potential control circuit supplies the second bulk bias in the active mode and the fourth bulk bias in the standby mode.

6. The inverter chain of claim 1, wherein
the first potential control circuit supplies a first bulk bias in a standby mode and a third bulk bias in an active mode; and
the second potential control circuit supplies a second bulk bias in the active mode and a fourth bulk bias in the standby mode.

7. An inverter chain, comprising:
a plurality of inverters connected in series, each succeeding inverter having a different set of bulk biases applied thereto than a set of bulk biases applied to a preceding inverter, the bulk biases applied to the inverters being fixed;
a first potential control circuit selectively supplying a higher potential to at least one of the inverters in the series based on an operating mode of the inverter chain; and
a second potential control circuit selectively supplying a potential to at least a different one of the inverters in the series based on the operating mode of the inverter chain.

8. The inverter chain of claim 7, wherein even numbered inverters in the series have a same first set of bulk biases applied thereto and odd numbered inverters in the series have a same second set of bulk biases applied thereto, the first set of bulk biases differing from the second set of bulk biases.

9. The inverter chain of claim 7, wherein each inverter in the series comprises:

a PMOS transistor and an NMOS transistor connected in series between the higher and lower potentials.

10. The inverter chain of claim 9, wherein
the succeeding inverter has a first bulk bias applied to the PMOS transistor and a second bulk bias applied to the NMOS transistor; and
the preceding inverter has a third bulk bias applied to the PMOS transistor and a fourth bulk bias applied to the NMOS transistor, the first bulk bias being greater the third bulk bias, the third bulk bias being greater than the second bulk bias, and the second bulk bias being greater than the fourth bulk bias.

11. The inverter chain of claim 10, wherein
the first potential control circuit selectively supplies the first and third bulk bias to a source of the PMOS transistor in the succeeding inverter based on the operating mode of the inverter chain; and
the second potential control circuit selectively supplies the second and fourth bulk bias to a source of the NMOS transistor in the preceding inverter based on the operating mode of the inverter chain.

12. The inverter chain of claim 11, wherein
the first potential control circuit supplies the first bulk bias in a standby mode and the third bulk bias in an active mode; and
the second potential control circuit supplies the second bulk bias in the active mode and the fourth bulk bias in the standby mode.

13. A method of operating an inverter chain having a plurality of inverters greater than two connected in series, comprising:
applying a different set of fixed bulk biases to a succeeding inverter than a set of fixed bulk biases applied to a preceding inverter regardless of an operating mode of the inverter chain, each inverter in the series including a PMOS transistor and an NMOS transistor connected in series between a higher potential and a lower potential;
selectively supplying the higher potential to at least one of the inverters in the series based on the operating mode of the inverter chain; and
selectively supplying the lower potential to at least a different one of the inverters in the series based on the operating mode of the inverter chain.

14. The method of operation of claim 13, wherein even numbered inverters in the series have a same first set of bulk biases applied thereto and odd numbered inverters in the series have a same second set of bulk biases applied thereto, the first set of bulk biases differing from the second set of bulk biases.

15. The method of operation of claim 13, wherein
the succeeding inverter has a first bulk bias applied to the PMOS transistor and a second bulk bias applied to the NMOS transistor; and
the preceding inverter has a third bulk bias applied to the PMOS transistor and a fourth bulk bias applied to the NMOS transistor, the first bulk bias being greater the third bulk bias, the third bulk bias being greater than the second bulk bias, and the second bulk bias being greater than the fourth bulk bias.

16. The method of operation of claim 15, wherein
the selectively supplying a higher potential step selectively supplies the first and third bulk bias to a source of the PMOS transistor in the succeeding inverter based on the operating mode of the inverter chain; and
the selectively supplying a lower potential step selectively supplies the second and fourth bulk bias to a source of the NMOS transistor in the preceding inverter based on the operating mode of the inverter chain.

17. The method of operation of claim 16, wherein
the selectively supplying a higher potential step selectively supplies the first bulk bias in a standby mode and the third bulk bias in an active mode; and
the selectively supplying a lower potential step selectively supplies the second bulk bias in the active mode and the fourth bulk bias in the standby mode.

18. The method of operation of claim 13, wherein
the selectively supplying a higher potential step selectively supplies a first bulk bias in a standby mode and a third bulk bias in an active mode; and
the selectively supplying a lower potential step selectively supplies a second bulk bias in the active mode and a fourth bulk bias in the standby mode.

19. A method of operating an inverter chain having a plurality of inverters connected in series, comprising:
applying a different set of fixed bulk biases to a succeeding inverter than a set of fixed bulk biases applied to a preceding inverter regardless of an operating mode of the inverter chain;
selectively supplying a higher potential to at least one of the inverters in the series based on an operating mode of the inverter chain; and
selectively supplying a lower potential to at least a different one of the inverters in the series based on the operating mode of the inverter chain.

20. The method of operation of claim 19, wherein even numbered inverters in the series have a same first set of bulk biases applied thereto and odd numbered inverters in the series have a same second set of bulk biases applied thereto, the first set of bulk biases differing from the second set of bulk biases.

21. The method of operation of claim 19, wherein each inverter in the series comprises:
a PMOS transistor and an NMOS transistor connected in series between the higher and lower potentials.

22. The method of operation of claim 21, wherein
the succeeding inverter has a first bulk bias applied to the PMOS transistor and a second bulk bias applied to the NMOS transistor; and
the preceding inverter has a third bulk bias applied to the PMOS transistor and a fourth bulk bias applied to the NMOS transistor, the first bulk bias being greater the third bulk bias, the third bulk bias being greater than the second bulk bias, and the second bulk bias being greater than the fourth bulk bias.

23. The method of operation of claim 22, wherein
the selectively supplying a higher potential step selectively supplies the first and third bulk bias to a source of the PMOS transistor in the succeeding inverter based on the operating mode of the inverter chain; and
the selectively supplying a lower potential step selectively supplies the second and fourth bulk bias to a source of the NMOS transistor in the preceding inverter based on the operating mode of the inverter chain.

24. The method of operation of claim 23, wherein
the selectively supplying a higher potential step selectively supplies the first bulk bias in a standby mode and the third bulk bias in an active mode; and
the selectively supplying a lower potential step selectively supplies the second bulk bias in the active mode and the fourth bulk bias in the standby mode.

* * * * *